(12) United States Patent
Ikeda et al.

(10) Patent No.: US 12,205,800 B2
(45) Date of Patent: Jan. 21, 2025

(54) PLASMA PROCESSING APPARATUS AND PLASMA PROCESSING METHOD

(71) Applicant: Tokyo Electron Limited, Tokyo (JP)

(72) Inventors: Taro Ikeda, Nirasaki (JP); Haruhiko Furuya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/932,791

(22) Filed: Sep. 16, 2022

(65) Prior Publication Data
US 2023/0106303 A1 Apr. 6, 2023

(30) Foreign Application Priority Data
Sep. 17, 2021 (JP) ................................. 2021-152616

(51) Int. Cl.
*H01J 37/32* (2006.01)
*C23C 16/455* (2006.01)
*C23C 16/511* (2006.01)

(52) U.S. Cl.
CPC .. *H01J 37/32275* (2013.01); *C23C 16/45565* (2013.01); *C23C 16/511* (2013.01); *H01J 37/32238* (2013.01); *H01J 2237/332* (2013.01)

(58) Field of Classification Search
CPC ........... H01J 37/32192; H01J 37/32201; H01J 37/32211; H01J 37/3222; H01J 37/32229; H01J 37/32238; H01J 37/32247; H01J 37/32266; H01J 37/32275; H01J 37/32293; H01J 37/32311; H01J 37/32541; C23C 16/45536; C23C 16/45538; C23C 16/4554; C23C 16/45542; C23C 16/45565; C23C 16/511; C23C 16/513; C23C 16/517; H01L 21/67069
See application file for complete search history.

(56) References Cited

U.S. PATENT DOCUMENTS

| | | | | |
|---|---|---|---|---|
| 6,641,673 | B2 * | 11/2003 | Yang | C23C 16/513 118/723 R |
| 10,312,057 | B2 * | 6/2019 | Kohno | H01J 37/3222 |
| 2005/0251990 | A1 * | 11/2005 | Choi | C23C 16/455 29/458 |
| 2006/0042546 | A1 * | 3/2006 | Ishii | H01J 37/32192 118/723 MW |
| 2008/0213504 | A1 * | 9/2008 | Ishikawa | H01J 37/3244 118/712 |

(Continued)

FOREIGN PATENT DOCUMENTS

JP 2017-033749 A 2/2017
KR 10-2021-0054457 A 5/2021

*Primary Examiner* — Kurt Sweely
(74) *Attorney, Agent, or Firm* — Armstrong Teasdale LLP

(57) ABSTRACT

A plasma processing apparatus includes: a chamber; a stage provided in the chamber; a microwave transmission window provided on a wall surface of the chamber; a microwave supply configured to supply microwaves into the chamber via the microwave transmission window; a shower plate configured to partition an interior of the chamber into a plasma generation space, which is a region where the microwave transmission window is disposed, and a processing space, which is a region where the stage is disposed; and a protrusion protruding from the shower plate into the plasma generation space and including a conductor in at least a portion of the protrusion.

15 Claims, 12 Drawing Sheets

(56) References Cited

U.S. PATENT DOCUMENTS

| | | | |
|---|---|---|---|
| 2015/0211124 A1* | 7/2015 | Nozawa | H01J 37/32834 118/723 MW |
| 2015/0371828 A1* | 12/2015 | Stowell | C23C 16/4405 118/723 AN |
| 2016/0177448 A1* | 6/2016 | Ikeda | H01J 37/32449 118/723 AN |
| 2016/0184838 A1* | 6/2016 | Byun | H01J 37/3244 239/548 |
| 2016/0222516 A1* | 8/2016 | Ikeda | C23C 16/511 |
| 2016/0358758 A1* | 12/2016 | Hirano | H01J 37/32238 |
| 2017/0032933 A1* | 2/2017 | Harada | H01J 37/3222 |
| 2017/0309452 A1* | 10/2017 | Fujino | H01J 37/3244 |
| 2018/0114677 A1* | 4/2018 | Komatsu | H01J 37/32192 |

\* cited by examiner

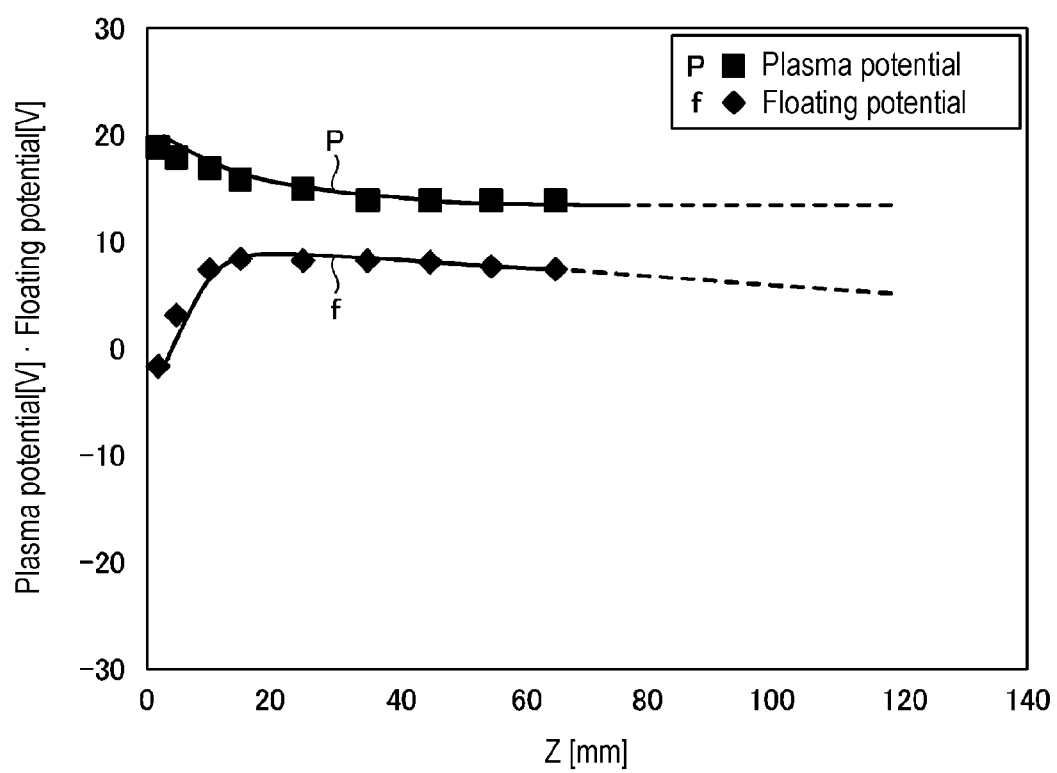

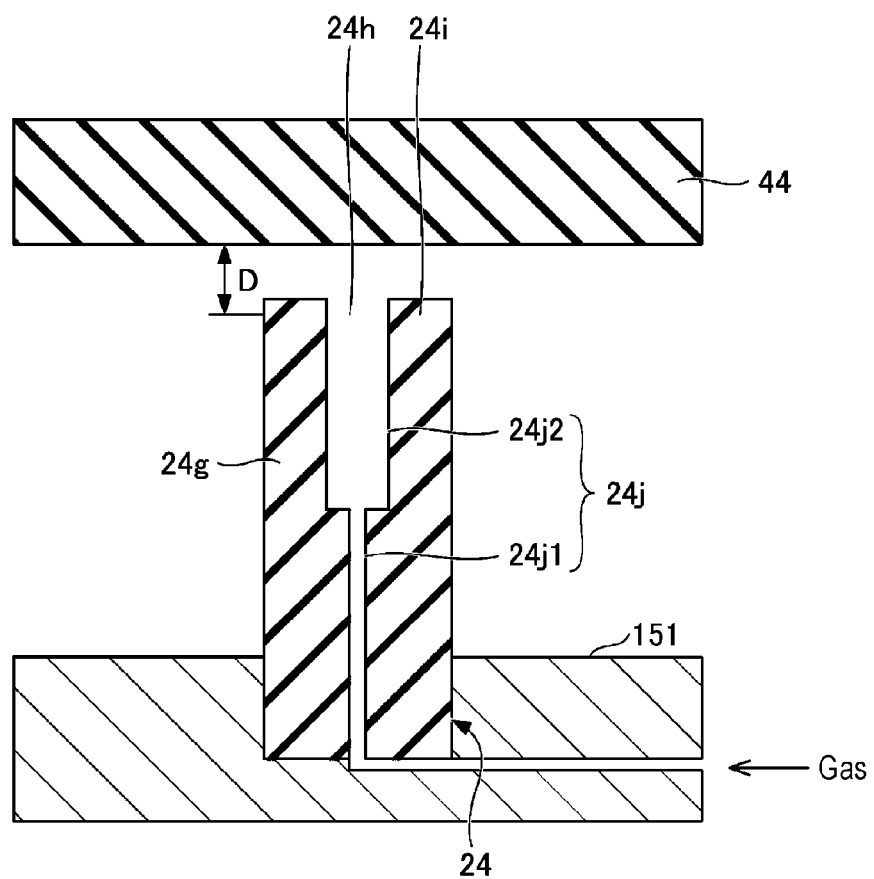

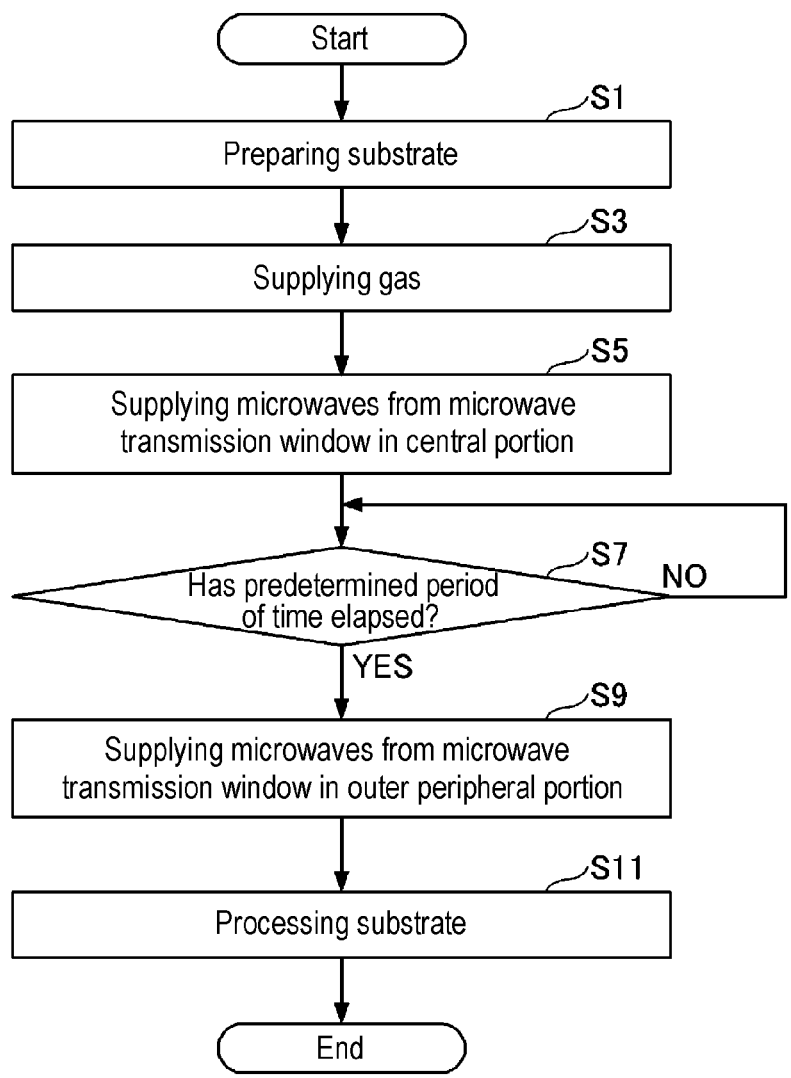

PLASMA PROCESSING APPARATUS AND PLASMA PROCESSING METHOD

CROSS-REFERENCE TO RELATED APPLICATION

This application is based upon and claims the benefit of priority from Japanese Patent Application No. 2021-152616, filed on Sep. 17, 2021, the entire contents of which are incorporated herein by reference.

TECHNICAL FIELD

The present disclosure relates to a plasma processing apparatus and a plasma processing method.

BACKGROUND

For example, a plasma processing apparatus of Patent Document 1 includes a plurality of microwave radiators disposed on a ceiling wall of a chamber, and a shower plate disposed below the plurality of microwave radiators and made of a conductive material set to a ground potential. When microwaves are radiated from the microwave radiators, surface waves generated directly below a microwave radiation surface are confined in a space, which is a high-electric field region surrounded by the microwave radiation surface and the shower plate, so as to maintain high power absorption efficiency of plasma generated in the space.

In order to obtain a high-quality film at a low temperature, it is important to form the film by using plasma. In recent years, due to the progress of thinner film formation, film formation through a plasma atomic layer deposition (ALD) method has been adopted. By using plasma, a high-quality thin film may be obtained at a low temperature, but electrical damage or physical damage to the film may become a problem. In order to solve such a problem, film formation through an ALD method using a remote source has been proposed. Such a remote source often uses radio-frequency waves that are easily operated by an ALD method (radio-frequency waves having a frequency lower than the microwave band (300 MHz to 3 THz)) during film formation. It is known that generation efficiency of radicals increases as the frequency increases, as in the microwave band.

PRIOR ART DOCUMENT

Patent Document

Patent Document 1: Japanese Patent Laid-Open Publication No. 2017-33749

SUMMARY

According to one embodiment of the present disclosure, a plasma processing apparatus includes: a chamber; a stage provided in the chamber; a microwave transmission window provided on a wall surface of the chamber; a microwave supply configured to supply microwaves into the chamber via the microwave transmission window; a shower plate configured to partition an interior of the chamber into a plasma generation space, which is a region where the microwave transmission window is disposed, and a processing space, which is a region where the stage is disposed; and a protrusion protruding from the shower plate into the plasma generation space and including a conductor in at least a portion of the protrusion.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a graph representing an example of a relationship between a plasma potential and a floating potential.

FIG. 7 is a cross-sectional view illustrating Modification 1 of the protrusion according to the embodiment.

FIG. 9 is a flowchart illustrating a plasma processing method according to an embodiment.

DETAILED DESCRIPTION

Figure 1:
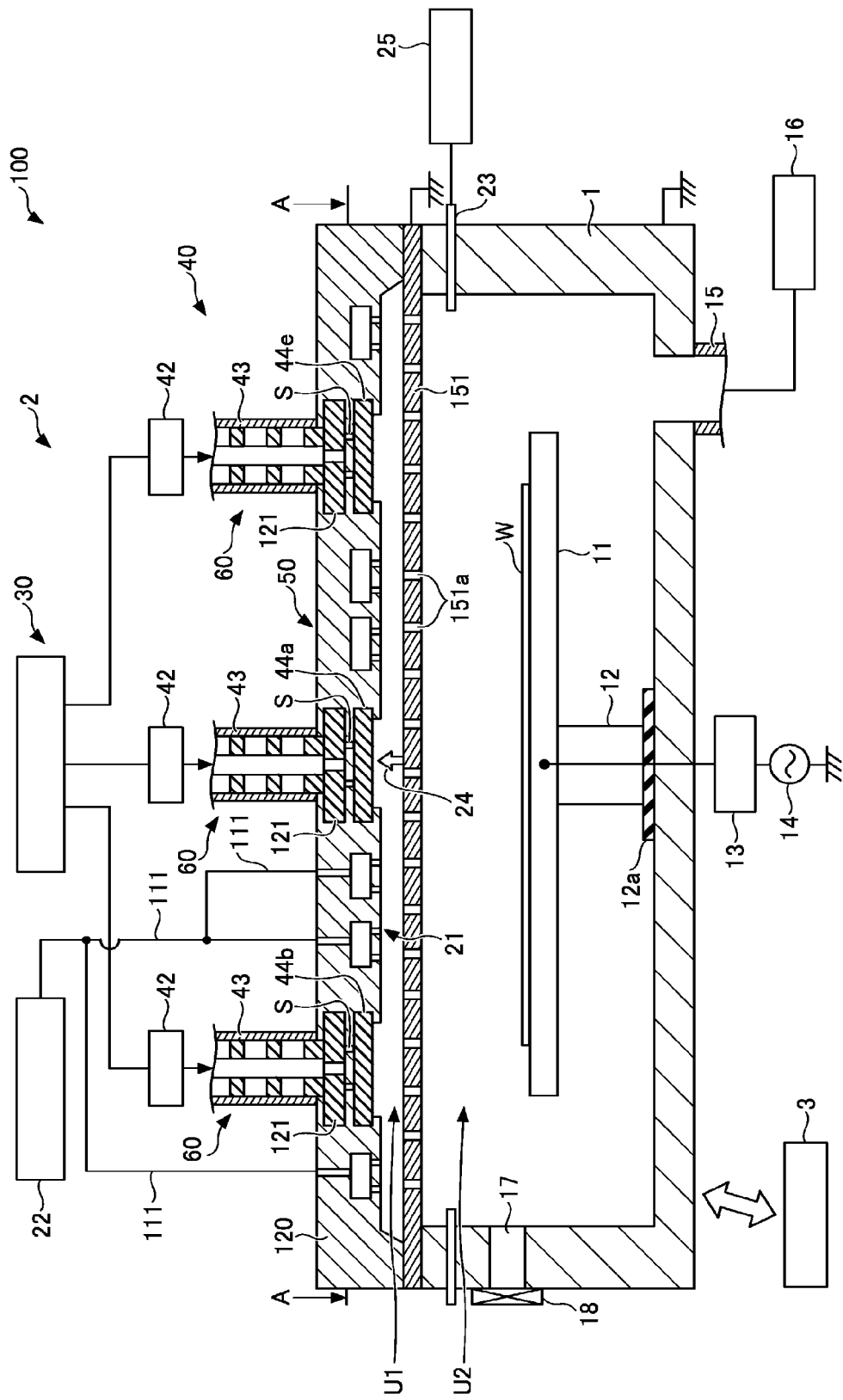
FIG. 1 is a cross-sectional view illustrating a plasma processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components may be denoted by the same reference numerals, and redundant descriptions thereof may be omitted.

[Plasma Processing Apparatus]

Figure 2:
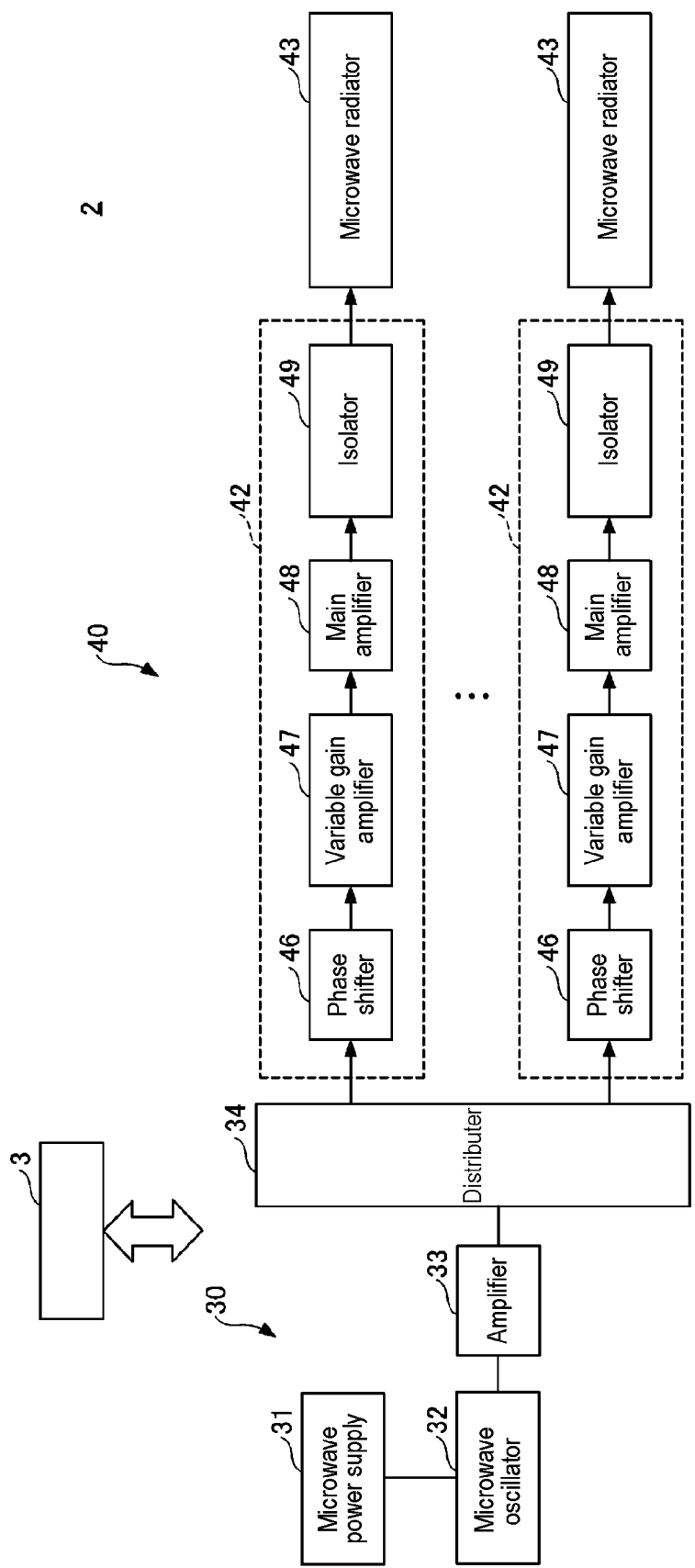
FIG. 2 is a block diagram illustrating a configuration of a microwave plasma source illustrated in FIG. 1.
Figure 3:
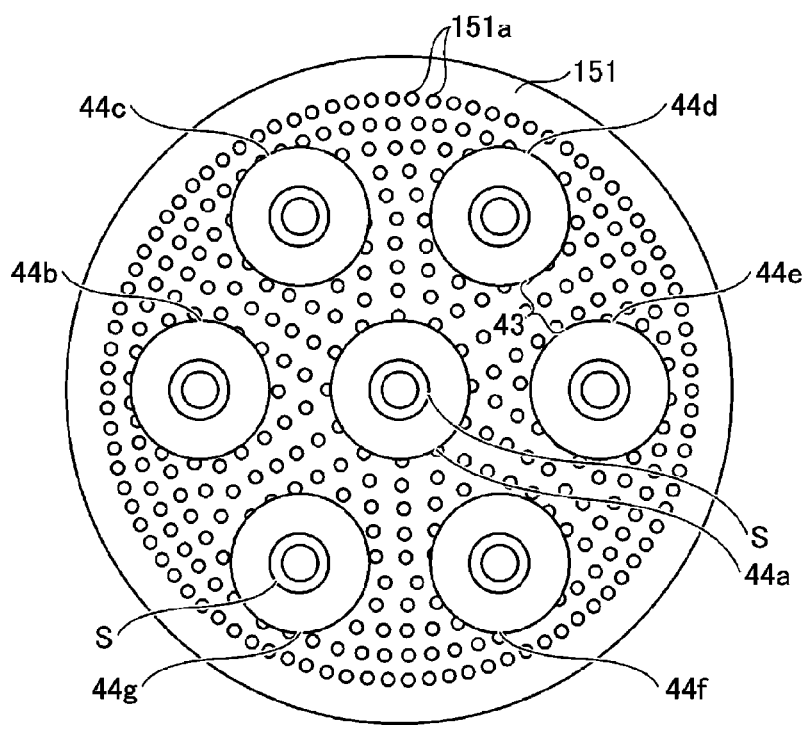
FIG. 3 is a plan view illustrating microwave transmission windows and a shower plate viewed from plane A-A illustrated in FIG. 1.

First, a plasma processing apparatus 100 according to an embodiment will be described with reference to FIGS. 1 to 3. FIG. 1 is a cross-sectional view illustrating a plasma processing apparatus according to an embodiment. FIG. 2 is a block diagram illustrating a configuration of a microwave plasma source used in the plasma processing apparatus of FIG. 1. FIG. 3 is a plan view illustrating microwave transmission windows and a shower plate viewed from plane A-A illustrated in FIG. 1.

The plasma processing apparatus 100 generates surface wave plasma by microwaves and performs a predetermined plasma process on a wafer. Examples of the plasma process include a film forming process or an etching process.

The plasma processing apparatus 100 includes a substantially cylindrical grounded chamber 1, which is configured airtightly and made of a metallic material such as aluminum or stainless steel, and a microwave plasma source 2 configured to introduce the microwaves into a chamber 1 to generate the surface wave plasma. An opening is formed in an upper portion of the chamber 1, and the microwave plasma source 2 is provided to face an interior of the chamber 1 from the opening via a shower plate 151.

The plasma processing apparatus 100 includes a controller 3 provided with a microprocessor. The controller (control device) 3 may be a computer having a processor and a memory. The controller 3 includes an arithmetic unit, a storage, an input device, a display device, an input/output interface for signals, and the like. The controller 3 controls individual components of the plasma processing apparatus 100 including the microwave plasma source 2. The controller 3 can perform a command input operation and the like by using the input device so that an operator manages the plasma processing apparatus 100. In addition, the controller 3 can visualize and display an operation situation of the plasma processing apparatus 100 by using the display device. In addition, the memory stores a control program and recipe data. The control program is executed by the processor of the controller 3 so that various processes in the plasma processing apparatus 100 are executed. By executing the control program by the processor to control individual components of the plasma processing apparatus 100, various processes, such as a plasma processing method of the present disclosure, are executed in the plasma processing apparatus 100 according to the recipe data.

A stage 11 is provided in the chamber 1. The stage 11 horizontally supports a semiconductor wafer (hereinafter, referred to as a "wafer W") as an example of a substrate. The stage 11 is supported by a cylindrical support 12, which is erected at a center of a bottom of the chamber 1 via an insulator 12a. Examples of a material forming the stage 11 and the support 12 include a metal such as aluminum having an alumite-processed (anodized) surface and an insulator (ceramic or the like) having a radio-frequency electrode therein.

Although not illustrated, the stage 11 is provided with an electrostatic chuck configured to electrostatically attract the wafer W, a temperature control mechanism, a gas flow path configured to supply a heat transfer gas to a rear surface of the wafer W, lifting pins configured to move up and down in order to transfer the wafer W, and the like. In addition, a radio-frequency bias power supply 14 is electrically connected to the stage 11 via a matcher 13. By supplying radio-frequency power to the stage 11 from the radio-frequency bias power source 14, ions in plasma are drawn into the wafer W. The radio-frequency bias power source 14 may not be provided, depending on characteristics of a plasma process.

An exhaust pipe 15 is connected to the bottom of the chamber 1, and an exhaust device 16 including a vacuum pump is connected to the exhaust pipe 15. By operating the exhaust device 16, the interior of the chamber 1 is evacuated, whereby the interior of the chamber 1 can be depressurized at a high speed to a predetermined degree of vacuum. A side wall of the chamber 1 is provided with a load/unload port 17 for loading and unloading the wafer W and a gate valve 18 for opening and closing the load/unload port 17.

The microwave plasma source 2 includes a microwave output 30, a microwave supply 40, and a microwave radiation plate 50. The microwave output 30 distributes microwaves into a plurality of paths and outputs the distributed microwaves. The microwave supply 40 transmits the microwaves output from the microwave output 30 and radiates the microwaves into the chamber 1.

The microwave radiation plate 50 constitutes a ceiling wall of the chamber 1. The microwave radiation plate 50 includes microwave transmission windows 44a to 44g (see FIG. 3) provided on a surface of the ceiling wall of the chamber 1. Bottom surfaces of the microwave transmission windows 44a to 44g serve as microwave radiation surfaces. The microwave transmission windows 44a to 44g are also collectively referred to as a microwave transmission window 44 or microwave transmission windows 44. FIG. 1 illustrates three microwave transmission windows 44a, 44b, and 44e among the seven microwave transmission windows 44. The microwave supply 40 supplies the microwaves into the chamber 1 via the microwave transmission windows 44.

The shower plate 151 is provided at a position directly below the microwave transmission windows 44 so as to face the microwave transmission windows 44. The shower plate 151 is made of a conductive material, and includes a plurality of through-holes 151a. The shower plate 51 is supported by the side wall of the chamber 1, and is grounded. The shower plate 151 partitions the interior of the chamber 1 into a plasma generation space U1, which is a region on a side of the microwave transmission windows 44, and a processing space U2 which is a region on a side of the stage 11.

The microwave radiation plate 50 is provided with a first gas introducer 21 having a shower structure. A first gas source 22 is connected to the first gas introducer 21 via a gas pipe 111. A first gas, which is a plasma generation gas (e.g., Ar gas) or a gas to be decomposed with high energy (e.g., $O_2$ gas or $N_2$ gas), is supplied into the plasma generation space U1 from the first gas source 22 via the first gas introducer 21.

In the side wall of the chamber 1, a second gas introducer 23 having an annular shape is provided below the shower plate 151 and above the stage 11. A second gas, which is a processing gas (e.g., silane ($SiH_4$) gas, a $C_5F_8$ gas, or the like) to be supplied without being decomposed in comparison with the first gas, is supplied from the second gas source 25 to the second gas introducer 23 during a plasma process, such as a film forming process or an etching process. As the gases supplied from the first gas source 22 and the second gas source 25, various gases may be used according to the content of the plasma process.

Next, a detailed structure of the microwave plasma source 2 will be described. As described above, the microwave plasma source 2 includes the microwave output 30, the microwave supply 40, and the microwave radiation plate 50. As illustrated in FIG. 2, the microwave output 30 includes a microwave power supply 31, a microwave oscillator 32, an amplifier 33 configured to amplify oscillated microwaves, and a distributor 34 configured to distribute the amplified microwaves into a plural number thereof.

The microwave oscillator 32 oscillates microwaves of a predetermined frequency, for example, PLL oscillation. The distributor 34 distributes the microwaves amplified by the amplifier 33 while performing an impedance matching between an input side and an output side so that loss of the microwaves is minimized. As the frequency of the microwaves, various frequencies within a range of 700 MHz to 3 GHz may be used.

As illustrated in FIGS. 1 and 2, the microwave supply 40 includes a plurality of amplifiers 42 that mainly amplifies the microwaves distributed by the distributor 34, and a plurality of microwave radiators 43 provided correspondingly to the amplifiers 42. The microwave supply 40 includes seven amplifiers 42 and seven microwave radiators 43. The seven microwave radiators 43 are provided on the circular microwave radiation plate 50, such that six microwave radiators 43 are disposed along a circumference in an outer peripheral portion of the microwave radiation plate 50 and one microwave radiator 43 is disposed in a central portion thereof. The microwaves propagating through the seven microwave radiators 43 are radiated from the seven microwave transmission windows 44 toward the interior of the chamber 1.

FIG. 3 is a plan view illustrating the microwave transmission windows and the shower plates when viewed from plane A-A illustrated in FIG. 1, in which illustration of the main body 120 is omitted. As illustrated in FIG. 3, the microwave transmission windows 44 are provided in the central portion of the surface of the ceiling wall of the chamber 1 and the outer peripheral portion surrounding the central portion, and include one microwave transmission window 44a in the central portion and six microwave transmission windows 44b to 44g in the outer peripheral portion.

As illustrated in FIG. 2, the amplifiers 42 of the microwave supply 40 amplify the microwaves distributed by the distributor 34 and guide the microwaves to respective microwave radiators 43. Each of the amplifiers 42 includes a phase shifter 46, a variable gain amplifier 47, a main amplifier 48, and an isolator 49.

The phase shifter 46 has a function of changing a phase of the microwaves and, by such a phase control, radiation characteristics are modulated. For example, by adjusting the phase for each of the microwave radiators 43, directivity is controlled to change a plasma distribution. In addition, it is possible to obtain circular polarization by shifting phases by 90 degrees in adjacent microwave radiators 43. In addition, the phase shifter 46 may be used for the purpose of spatial synthesis in the microwave radiator 43 by adjusting delay characteristics among components in the amplifiers. However, when it is not necessary to modulate the radiation characteristics or adjust the delay characteristics among the components in the amplifiers, the phase shifter 46 may not be provided.

The variable gain amplifier 47 is an amplifier for adjusting a power level of the microwaves input to the main amplifier 48 to adjust plasma intensity. By changing the variable gain amplifier 47 for each of the microwave radiators 43, it is possible to generate a distribution in generated plasma.

The main amplifier 48 constitutes a solid state amplifier, and includes, for example, an input matching circuit, a semiconductor amplification element, an output matching circuit, and a high Q resonance circuit.

The isolator 49 separates reflected waves of microwaves, which are reflected by a slot antenna S illustrated in FIGS. 1 and 3 and directed toward the main amplifier 48, and includes a circulator and a dummy load (a coaxial terminator). The circulator guides the reflected waves to the dummy load, and the dummy load converts the reflected waves guided by the circulator into heat.

As illustrated in FIG. 1, each of the microwave radiators 43 includes a tuner 60. The tuner 60 has a function of transmitting microwaves fed from the amplifier 42 and matching impedances. The tuner 60 is installed on a top surface of the microwave radiation plate 50.

The microwave radiation plate 50 has the metallic main body 120. As a metal constituting the main body 120, it is desirable to use a metal having high thermal conductivity, such as aluminum or copper. A slow-wave member 121 and the microwave transmission window 44, which constitute a portion of the microwave radiator 43, are fitted in each opening in the main body 120. The slow-wave member 121 and the microwave transmission window 44 are made of a dielectric material and have a disk shape, and are provided at a position corresponding to each tuner 60. A slot S (see FIG. 3) is formed in a portion within the main body 120 between the slow-wave member 121 and the microwave transmission window 44, and constitutes a flat slot antenna.

The slow-wave member 121 has a dielectric constant greater than that of vacuum, and is made of, for example, quartz, ceramic, a fluorine-based resin such as polytetrafluoroethylene, or a polyimide-based resin. Since a wavelength of microwaves becomes long in a vacuum, the slow-wave member 121 has a function of shortening a wavelength of microwaves to reduce the antenna in size.

The microwave transmission window 44 is made of a dielectric material which is a material that transmits microwaves, and has a function of forming uniform surface wave plasma in a circumferential direction. Similar to the slow-wave member 121, the microwave transmission window 44 may be made of, for example, quartz, ceramic, a fluorine-based resin such as polytetrafluoroethylene, or a polyimide-based resin. The radiation surface (bottom surface) of the microwave transmission window 44 is exposed to the plasma generation space U1 in the chamber 1 at a position recessed inward from the bottom surface of the main body 120.

The slot S is provided to penetrate from a top surface position in contact with the slow-wave member 121 to a bottom surface position in contact with the microwave transmission window 44, and has a shape appropriate for desired microwave radiation characteristics, for example, an arc shape or a circumferential shape. A peripheral portion of the slot S between the main body 120 and the microwave transmission window 44 is sealed by a seal ring (not illustrated), so that the microwave transmission window 44 covers and seals the slot S to serve as a vacuum seal.

An interior of the slot S may be a vacuum, but it is desirable that the interior of the slot S is filled with a dielectric material. By filling the slot S with a dielectric material, an effective wavelength of microwaves is shortened, and thus it is possible to reduce a thickness of the slot. As the dielectric material to be filled in the slot S, for example, quartz, ceramic, a fluorine-based resin such as polytetrafluoroethylene, or a polyimide-based resin may be used.

The microwaves transmitted through the tuner 60 as TEM waves are introduced into an interior of the microwave radiation plate 50, and pass through the slow-wave member 121. Then, the microwaves are transmitted to the slot S of the slot antenna and mode-converted to TE waves. In addition, the microwaves are transmitted through the microwave transmission window 44 and radiated into the chamber 1. Thus, surface waves are formed on a surface of the microwave transmission window 44. By the surface waves, the first gas introduced into the chamber 1 from the first gas introducer 21 is turned into plasma, so that surface wave plasma is generated in the space of the chamber 1. Therefore, the bottom surface of the microwave transmission window 44 becomes the microwave radiation surface.

Electric field strength in the chamber 1 when the microwaves are radiated from the microwave radiation surface has a maximum value at a bottom surface position of the microwave transmission window 44, which is the microwave radiation surface, and decreases sharply as a distance from the microwave radiation surface increases.

The shower plate 151 provided directly below the microwave radiation plate 50 is disposed in such a high electric field forming region. The microwave radiation plate 50 has an outer peripheral wall, which extends downward around the bottom surface thereof including the microwave radiation surface and forms a portion of the side wall of the chamber 1, and the shower plate 151 is installed between the outer peripheral wall of the microwave radiation plate 50 and a side wall portion of the chamber 1. The plasma generation space U1 is defined by the microwave radiation plate 50 and the shower plate 151. When the microwaves are radiated from the microwave radiators 43, the plasma generation space U1 becomes a high electric field region, and plasma is formed in the plasma generation space U1.

The shower plate 151 is set to a ground potential. The shower plate 151 has a function of confining, in the plasma generation space U1 which is a high electric field region, surface waves formed directly below the microwave radiation surface of the microwave transmission windows 44 when the microwaves are radiated from the microwave radiation surfaces of the microwave transmission windows 44, and maintaining the power absorption efficiency of plasma to be high.

In the present disclosure, a protrusion 24 is provided correspondingly to the microwave transmission window 44a in the central portion. The protrusion 24 protrudes in the plasma generation space U1 from a top surface of the shower plate 151 toward a substantially center of the microwave transmission window 44a in the central portion, and includes a conductor in at least a portion thereof. The protrusion 24 functions as a plasma ignition source. A configuration and function of the protrusion 24 will be described later.

With this configuration, a stable discharge easily occurs in the plasma generation space U1 while it becomes difficult for an abnormal discharge to occur, and it is possible to improve ignitability of the plasma. As the conductive material constituting the shower plate 151, a metal having good electrical conductivity, such as aluminum or copper, may be appropriately used. It is desirable that a thickness of the shower plate 151 is about 10 mm to 30 mm, and it is desirable that a hole diameter of the through-holes 151a in the shower plate 151 is about 3 mm to 5 mm.

In order for the shower plate 151 to effectively exhibit an ion shielding function, it is desirable that a distance from the microwave radiation surface to the top surface of the shower plate 151 is 13 mm to 28 mm, specifically, 18 mm to 28 mm.

The plasma generation space U1 is surrounded by the microwave radiation plate 50 and the shower plate 151, but radicals in the plasma may disappear due to metallic portions on a side surface and a bottom surface of the plasma generation space U1. In order to avoid disappearance of radicals, it is desirable to cover an inner side of the outer peripheral wall of the microwave radiation plate 50, which corresponds to the side surface of the chamber in the plasma generation space U1, with an insulating member, and to cover the top surface of the shower plate 151 constituting the bottom surface of the plasma generation space U1 with an insulating member.

[Protrusion (Plasma Ignition Source)]

In the plasma processing apparatus 100 configured as described above, the microwave supply 40 including microwave transmission windows 44 of seven microwave radiators 43 is mounted, and the shower plate 151 is disposed between the microwave transmission windows 44 and the stage 11. In addition, by providing the protrusion 24 at the position facing the microwave transmission window 44a in the central portion, it is possible to make the protrusion 24 function as a plasma ignition source and improve plasma ignition performance.

A configuration and function of the protrusion 24 will be described with reference to FIG. 1 and FIGS. 4A to 4C. In plasma ignition using microwaves, ignition performance is determined by a discharge electric field $E_{bd}$ represented by Equation (1).

$$E_{bd} = Dp^m \left[ 1 + \frac{(2\pi f)^2}{(Kp)^2} \right]^{1/2} \quad \text{Equation (1)}$$

In contrast, in a parallel plate type plasma processing apparatus, due to a discharge by radio-frequency power between a lower electrode and an upper electrode that face each other, ignition performance is determined by a discharge voltage $V_{bd}$ represented by Equation (2) according to Paschen's law.

$$V_{bd} = \left( \frac{Bpd}{\ln(Apd) - \ln[\ln(1 + 1/\gamma_{se})]} \right) \quad \text{Equation (2)}$$

D and K in Equation (1) are coefficients determined according to a gas type, p is a pressure in a chamber, and f is a frequency of electromagnetic waves. m is a constant (about 0.5) determined according to the gas type. In addition, A and B in Equation (2) are coefficients determined according to the gas type, p is a pressure in a chamber, d is a distance between a lower electrode and an upper electrode, and $\gamma_{se}$ is a secondary electron emission coefficient. The secondary electron emission coefficient is a coefficient determined according to materials and surface conditions of the lower electrode and the upper electrode.

That is, in the microwave plasma source 2, Paschen's law is not valid for plasma ignition. Therefore, in the microwave plasma source 2, the ignition performance is not determined by the discharge voltage $V_{bd}$ represented by Equation (2). In the microwave plasma source 2, when the discharge electric field $E_{bd}$ represented by Equation (1) is strengthened, ignition becomes easier.

Therefore, the protrusion 24 has a shape and arrangement that allow easy ignition particularly to microwaves and VHF waves of 150 MHz or more, and facilitates ignition of plasma in the plasma generation space U1. Specifically, the protrusion 24 protrudes from the shower plate 151 in the plasma generation space U1 and is spaced apart from the microwave transmission window 44a. The protrusion 24 protrudes substantially toward the center of the microwave transmission window 44a.

When microwaves are radiated into the plasma generation space U1 from the microwave radiation surfaces of the microwave transmission windows 44, the radiated microwaves are reflected by the conductor of the protrusion 24 protruding from a surface facing the microwave radiation surfaces, and the microwaves (reflected waves) return toward the microwave transmission window 44a. Then, standing waves are generated between the incident waves of the microwaves output from the microwave transmission windows 44 and the reflected waves reflected by the protrusion 24. An electric field strength in the plasma generation space U1 when the microwaves are radiated is the largest at positions of the bottom surfaces of the microwave transmission windows 44 as the microwave radiation surfaces. In addition, since a gap of the plasma generation space U1 is narrow, a high electric field is generated between the protrusion 24 in the plasma generation space U1 and the microwave transmission window 44a. Thus, plasma can be easily ignited. On the other hand, after the plasma ignition, the electric field between the protrusion 24 in the plasma generation space U1 and the microwave transmission window 44a does not increase.

The protrusion 24 that functions as the plasma ignition source as described above is a conductor or a dielectric material in which a conductor is embedded. As an example, the protrusion 24 may be a conductive rod-shaped member having, for example, a tip shaped like a tip of a mushroom (a tip having a substantially trapezoidal cross section). The entire protrusion 24 or the tip portion thereof may be covered with a dielectric material. For example, a portion of the protrusion 24 close to the microwave transmission window 44 may be formed of a dielectric material, and the conductor may be close to the microwave transmission window 44 via the dielectric material.

Figure 4A:
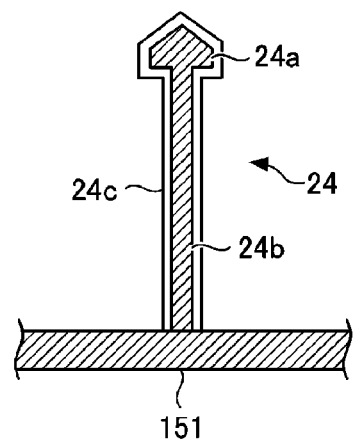
FIGS. 4A to 4C are cross-sectional views illustrating examples of a protrusion according to an embodiment.
Figure 4B:
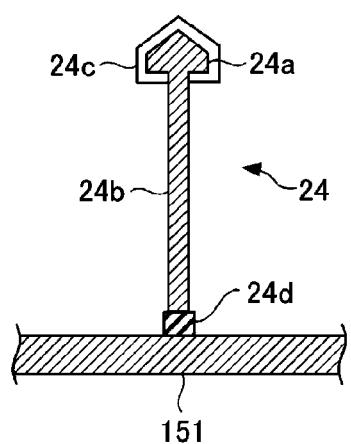
Figure 4C:
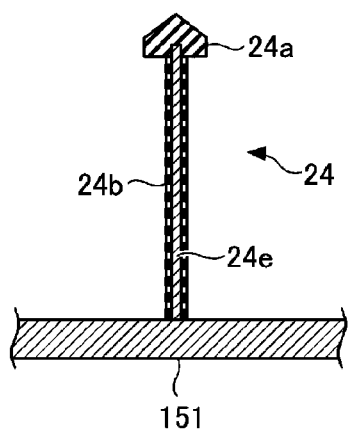

FIGS. 4A to 4C are cross-sectional views illustrating examples of the protrusion 24 according to an embodiment. In FIG. 4A, the protrusion 24 has a rod-shaped member 24b (including a tip portion 24a) made of a conductor, and a surface thereof is covered with a dielectric material 24c such as ceramic. The internal rod-shaped member 24b has the same potential as the shower plate 151, i.e., a ground potential. The dielectric material 24c may be omitted.

As illustrated in FIG. 4B, the protrusion 24 may be covered with the dielectric material 24c only at the tip portion 24a of the rod-shaped member 24b made of a conductor. In FIG. 4B, the rod-shaped member 24b is set to have a floating potential by interposing an insulating member 24d between the shower plate 151 and the rod-shaped member 24b.

In FIG. 4C, the rod-shaped member 24b (including the tip portion 24a) itself is made of a dielectric material such as ceramic, and an electrode 24e made of a conductor functioning as a passive ignition source is disposed inside the rod-shaped member 24b.

The protrusion 24 is a passive ignition source, and a voltage is not applied to the protrusion 24 itself. The protrusion 24 needs to have an electrode (conductor) for reflecting microwaves. Therefore, the protrusion 24 is not limited to the forms illustrated in FIG. 4A to 4C, and may have a form in which an electrode (conductor) functioning as a passive ignition source is provided in a vicinity of the microwave transmission window 44. In addition, the conductor portion of the protrusion 24 may have a ground potential or a floating potential, but the floating potential is more desirable than the ground potential. Even with the ground potential, the conductor portion of the protrusion 24 may function as a passive ignition source. However, considering contamination, particles, and damage, it is desirable that the tip portion 24a (the electrode or conductor portion) of the protrusion 24 has a floating potential. The reason will be described with reference to FIG. 5.

FIG. 5 is a graph representing an example of a relationship between a plasma potential and a floating potential. The horizontal axis Z of the graph of FIG. 5 represents a distance Z from the surface of the microwave transmission window 44 to a tip of the electrode (conductor) of the protrusion 24, and the vertical axis represents a plasma potential and a floating potential. The line P is a plasma potential corresponding to the distance Z, and the line f is a floating potential corresponding to the distance Z. The line f represents a case where the protrusion 24 is configured to have a floating potential. In this experiment, the pressure in the plasma generation space U1 was controlled to 0.5 Torr (67 Pa), and Ar gas was supplied into the plasma generation space U1 to generate plasma of the Ar gas.

According to FIG. 5, in a case where the rod-shaped member of the protrusion 24 had a ground potential, the plasma potential itself became an incident potential indicating a force when ions are incident on the rod-shaped member. As a result, when Z was about 10 mm, a voltage of about 17 eV was applied to the rod-shaped member. In contrast, in a case where the rod-shaped member had a floating potential, a voltage of about 10 eV was applied to the rod-shaped member when Z was about 10 mm, and thus the voltage applied to the rod-shaped member was reduced by a potential difference between the plasma potential of the line P and the floating potential of the line f. When the rod-shaped member is covered with ceramic, almost no damage occurs on the surface of the protrusion 24 with the voltage of about 10 eV.

From the foregoing, the shortest distance from the conductor located at the tip of the protrusion 24 to the radiation surface (surface) of the microwave transmission window 44 may be about 3 mm to 10 mm. However, when this shortest distance is about 5 mm to 10 mm, contamination, particles, and damage can be further suppressed. Therefore, it is more desirable that this shortest distance is about 5 mm to 10 mm.

The protrusion 24 can shorten a time for turning on plasma. The reason for this will be described. In a normal matcher, first, a matching position in the matcher is adjusted to a plasma ignition position. After plasma ignition, the matching position is mechanically moved to a subsequent matching position (a matching position after plasma ignition). It takes time to mechanically move the matching position.

In contrast, the microwave plasma source 2 is configured to be preset at a matching position after plasma ignition. Normally, plasma does not ignite at the matching position after plasma ignition. However, by providing the protrusion 24, the microwave plasma source 2 is configured to easily ignite plasma even at the matching position after the plasma ignition. Therefore, it is not necessary to move the matching position after the plasma is ignited.

For the reason described above, the protrusion 24 makes the movement of the matching position unnecessary, and the time for turning on the plasma can be shortened. Since it is possible to quickly ignite plasma after replacement of a gas, such a configuration is more appropriate for an atomic layer deposition (ALD) process and can improve the productivity. However, such a configuration is also be applicable to film formation by a chemical vapor deposition (CVD) method.

For example, in FIG. 1, one protrusion 24 is provided at a position facing the microwave transmission window 44a in the central portion. In film formation by a CVD method, unlike ALD, a process of repeating on and off of plasma in a short time of about several seconds is not performed. Therefore, when microwave power is supplied to the microwave transmission window 44a in the central portion to ignite plasma between the microwave transmission window 44a in the central portion and the protrusion 24, plasma in the vicinity of the microwave transmission windows 44b to 44g is also surely ignited by the electrons in the plasma ignited in the central portion. At this time, a delay time from the ignition on a side of the microwave transmission window 44a in the central portion to the ignition on a side of the microwave transmission windows 44b to 44g in the outer peripheral portion is on the order of milliseconds. For example, after the microwave power is supplied to the microwave transmission window 44a in the central portion, the microwave power is supplied to the microwave transmission windows 44b to 44g in the outer peripheral portion with a delay of 1 millisecond to 1 second. Even when the plasma ignition on the side of the microwave transmission windows 44b to 44g in the outer peripheral portion is delayed by 1 millisecond to 1 second from the plasma ignition on the side of the microwave transmission window 44a in the central portion, the process on the wafer W is not affected. Therefore, only one protrusion 24 may be disposed at a position facing the microwave transmission window 44a in the central portion. In addition, the protrusion 24 may be provided to face at least one of the plurality of microwave transmission windows 44 including the microwave transmission window 44a in the central portion and the microwave transmission windows 44b to 44g in the outer peripheral portion. However, by providing seven protrusions 24 to face the microwave transmission windows 44a to 44g in the central portion and the outer peripheral portion, respectively, it is possible to further improve the plasma ignition performance.

In film formation by an ALD method, a process of repeatedly switching on and off of plasma in a short time is performed. Therefore, there is a possibility of controlling the turning-on of plasma ignition on the order of milliseconds. Therefore, when the plasma ignition on the side of the microwave transmission windows 44b to 44g in the outer peripheral portion is delayed on the order of milliseconds after the plasma ignition on the side of the microwave transmission window 44a in the central portion, the film forming process may be affected.

Figure 6A:
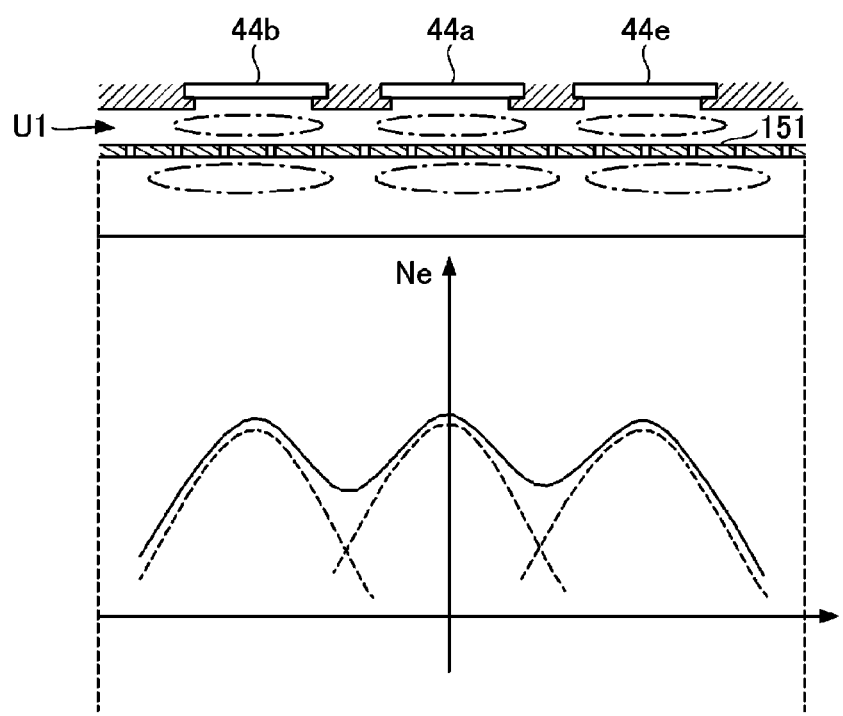
FIGS. 6A and 6B are views for explaining a relationship between an arrangement of protrusions and plasma electron densities.
Figure 6B:
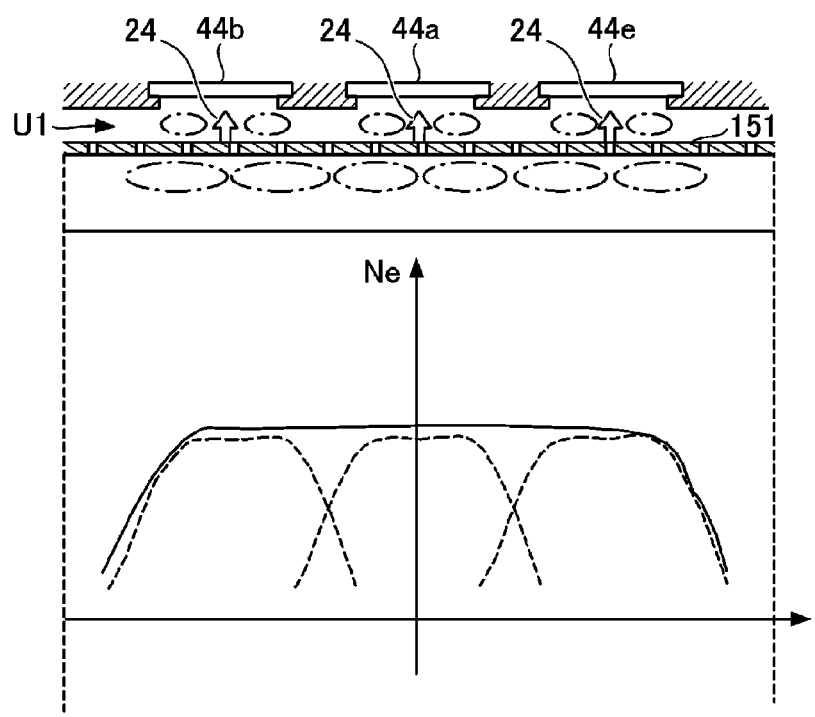

Therefore, as illustrated in FIG. 6B, one protrusion 24 is disposed at a position facing each of the microwave transmission windows 44a to 44g, that is, a total of seven protrusions 24 are disposed to protrude from the shower plate 151 toward respective microwave transmission windows 44. Thus, it is possible to turn plasma on and off in a short time below the seven microwave transmission windows 44. Therefore, the present embodiment is appropriate for a film forming process by an ALD method, and can also be used in a film forming process by a CVD method.

A relationship between arrangement of the protrusions 24 and the plasma electron density will be described with reference to FIGS. 6A and 6B. FIG. 6A shows a graph of a distribution of a plasma electron density Ne according to a comparative example in which no protrusion 24 is provided at any of the positions facing the microwave transmission window 44a in the central portion and the microwave transmission windows 44b to 44g in the outer peripheral portion. FIG. 6B shows a graph of the distribution of plasma electron density Ne according to the present embodiment in which the protrusions 24 are provided at all the positions facing the microwave transmission window 44a in the central portion and the microwave transmission windows 44b to 44g in the outer peripheral portion.

According to FIGS. 6A and 6B, in the comparative example of FIG. 6A, the plasma generated in the plasma generation space U1 by the microwaves radiated from the seven microwave transmission windows 44 has a peak of the plasma electron density Ne below each microwave transmission window 44, and the plasma electron density Ne has a mountain-shaped distribution. Therefore, in the comparative example, the distribution of the plasma electron density Ne in the plasma generation space U1 varies.

On the other hand, in the present embodiment of FIG. 6B, the plasma generated in the plasma generation space U1 below the seven microwave transmission windows 44 is donut-shaped, and the peak of the plasma electron density Ne below each microwave transmission window 44 is flattened. Thus, it is possible to alleviate the mountain-shaped distribution of the plasma electron density Ne at a low pressure and suppress variation in the distribution of the plasma electron density Ne.

In addition, the present embodiment is not limited to the case where the seven protrusions 24 are provided below the seven microwave transmission windows 44. Even when one protrusion 24 is provided in the central portion facing the one microwave transmission window 44a, it is possible to alleviate the mountain-shaped distribution of the plasma electron density Ne at a low pressure compared with the comparative example.

[Modifications of Protrusion]

Figure 8:
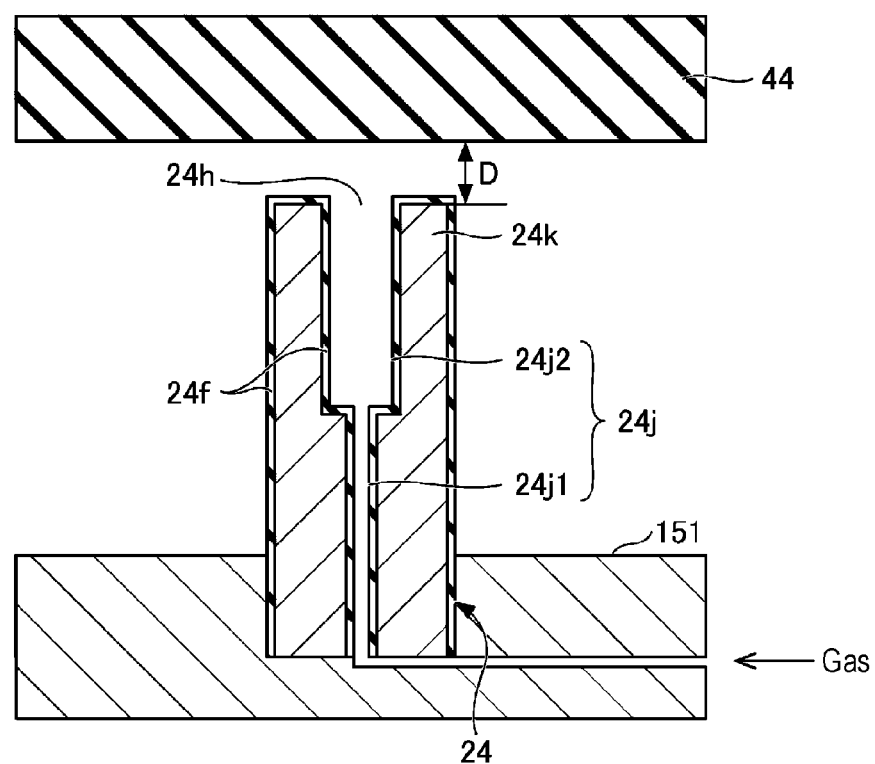
FIG. 8 is a cross-sectional view illustrating Modification 2 of the protrusion according to the embodiment.

Modifications 1 and 2 of the protrusion 24 functioning as a plasma ignition source described above will be described with reference to FIGS. 7 and 8. FIG. 7 is a view illustrating Modification 1 of the protrusion. FIG. 8 is a view illustrating Modification 2 of the protrusion.

The protrusions 24 according to Modifications 1 and 2 are partially embedded in the shower plate 151, protrude from the shower plate 151 to be close to the microwave transmission window 44, and include a conductor in at least a portion thereof. The conductor functions as an electrode. In addition, each of the protrusions 24 of Modifications 1 and 2 is provided with a gas hole 24j that is open toward the microwave transmission window 44, and an end surface of the gas hole 24j is enlarged in diameter. The gas hole 24j of the protrusion 24 is connected to the first gas source 22 in place of the first gas introducer 21 or together with the first gas introducer 21, and supplies the first gas from the first gas source 22 to the plasma generation space U1.

An entire columnar body of the protrusion 24 of Modification 1 in FIG. 7 is formed of a dielectric material 24g such as alumina, AlN, or quartz. Inside the protrusion 24 according to Modification 1, the gas hole 24j penetrating the protrusion 24 is formed. The gas hole 24j includes a fine hole 24j1 and an enlarged-diameter portion 24j2 expanded from the fine hole 24j1, and an opening 24h at a tip of the gas hole 24j is open from the enlarged-diameter portion 24j2 toward the microwave transmission window 44. A reducing gas is supplied from the gas hole 24j.

In the protrusion 24 of Modification 1, a conductor 24i is embedded in the dielectric material 24g. The conductor 24i is made of a metal such as aluminum and functions as an internal electrode. The conductor 24i has a donut shape (annular shape) and is embedded in a vicinity of the end face of the gas hole 24j and around an outer periphery of the enlarged-diameter portion 24j2. The conductor 24i is covered with the dielectric material 24g forming the protrusion 24 and is not exposed to an inner wall of the gas hole 24j.

In the protrusion 24 according to Modification 2, an entire columnar body is formed of a conductor 24k, and a periphery of the conductor 24k is covered with a dielectric material 24f such as alumina. In this case as well, the gas hole 24j is formed inside the protrusion 24, the gas hole 24j includes the fine hole 24j1 and the enlarged-diameter portion 24j2, and the opening 24h at the tip of the gas hole 24j is open from the enlarged-diameter portion 24j2 toward the microwave transmission window 44. Sizes of the fine hole 24j1 and the enlarged-diameter portion 24j2 of the gas hole 24j are the same in Modifications 1 and 2, and a depth (length) of the enlarged-diameter portion 24j2 from the tip of the gas hole 24j is 5 mm or more. The diameter of the fine hole 24j1 of the gas hole 24j is smaller than 1 mm, for example, 0.3 mm. The diameters of the enlarged diameter portion 24j2 and the opening 24h are 3 mm or more and ⅛ or less of a surface wave wavelength λ of the microwaves in plasma. By providing the enlarged-diameter portion 24*j*2 as described above, it is possible to suppress abnormal discharge in the gas hole 24*j*.

The distance D from the tip of the conductor 24*i* of FIG. 7 or the tip of the conductor 24*k* of FIG. 8 to the surface of the microwave transmission window 44 is a distance at which an electric field in a vicinity of the tip of the conductor 24*i* or the conductor 24*k* becomes sufficiently low, and may be about 3 mm to 10 mm. However, it is more desirable that the distance D is about 5 mm to 10 mm because contamination, particles, and damage can be further suppressed.

By embedding the conductor 24*i* in the dielectric material 24*g* and coating the conductor 24*k* with the dielectric material 24*f*, it is possible to enhance plasma resistance of the protrusion 24 and suppress consumption and deterioration due to plasma. Even with the configurations of the protrusions 24 in Modifications 1 and 2, it is possible to facilitate plasma ignition and improve gas decomposition efficiency. The shape of the tip of the protrusion 24 illustrated in each of FIGS. 7 and 8 may be a rounded shape with chamfered corners.

The gas hole 24*j* in the protrusion 24 ejects a gas toward the microwave transmission window 44. Therefore, by injecting the gas in a range where energy of electromagnetic waves is concentrated, the first gas, which is a reducing gas such as $N_2$ gas, can be sufficiently dissociated in the plasma generation space U1. Thus, it is possible to further improve the gas decomposition efficiency and radical generation efficiency. As a result, the protrusions 24 according to Modifications 1 and 2 have a function as a gas nozzle in addition to the function as a plasma ignition source.

Generation efficiency of radicals increases as a frequency increases. Therefore, according to the plasma processing apparatus 100 of the present disclosure, the radical generation efficiency can be improved by the function of microwave remote plasma having a frequency higher than that of a general high frequency (a frequency lower than the microwave band).

According to the plasma processing apparatus 100 of the present disclosure, in order to implement the function of microwave remote plasma, the shower plate 151 has a configuration in which the protrusion 24 that functions as a plasma ignition source (a passive ignition source) is provided. That is, by installing the protrusion 24 having a conductor at a distance of about 5 mm directly below the center of the radiation surface of the plurality of microwave transmission windows 44, the protrusion 24 is caused to act as a plasma ignition source. Accordingly, by installing the protrusion 24 in a region having the strongest ignition electric field below the radiation surface of the microwave transmission window 44 radiating the microwaves, it is possible to further strengthen the electric field below the microwave transmission window 44. Thus strengthened electric field enables plasma ignition at a matching position in a process execution time, so that it is possible to execute the process while omitting an impedance matching time. Thus, it is possible to provide microwave remote plasma capable of switching on and off of plasma ignition at a high speed.

Most of the ions in the plasma generated in the plasma generation space U1 as described above are removed when passing through the shower plate 151. Thus, it is possible to provide microwave remote plasma that supplies a large number of radicals to the processing space U2 while minimizing ions in plasma.

[Plasma Processing Method]

When seven protrusions 24 are installed in seven microwave transmission windows 44, microwave power is simultaneously supplied from the radiation surfaces of the microwave transmission windows 44 via all the microwave radiators 43, and plasma is ignited below each microwave transmission window 44.

When the protrusion 24 is installed only in the microwave transmission window 44*a* in the central portion, a plasma ignition sequence includes: igniting, first, plasma on the side of the microwave transmission window 44*a* in the central portion; and with a delay after the ignition, igniting plasma on the side of the microwave transmission windows 44*b* to 44*g* in the outer peripheral portion, so as to ignite the entire plasma. Regarding the plasma ignition sequence, a plasma processing method will be described with reference to FIG. 9. This plasma processing method is controlled by the controller 3 and executed by the plasma processing apparatus 100.

First, in step S1, the controller 3 loads the wafer W into the chamber 1 and places the wafer W on the stage 11. Subsequently, in step S3, the controller 3 supplies the first gas, such as a reducing gas to be decomposed with high energy, from the first gas source 22, and ejects the first gas from the first gas introducer 21 to the plasma generation space U1. When the protrusion 24 according to Modification 1 or 2 is used, the controller 3 supplies the first gas from the gas hole 24*j* to the vicinity of a microwave transmission window 44 of the plasma generation space U1. The first gas may be supplied from at least one selected from the group of the gas hole 24*j* and the first gas introducer 21. In addition, the controller 3 supplies the second gas, such as silane gas that is desired not to be decomposed, from the second gas source 25 such that the second gas is directly supplied to the processing space U2 from the second gas introducer 23.

Subsequently, in step S5, the controller 3 radiates microwaves from the microwave transmission window 44*a* in the central portion. Subsequently, in step S7, the controller 3 determines whether or not a predetermined period of time has elapsed. The predetermined period of time is, for example, 1 millisecond to 1 second.

In step S7, the controller 3 waits until the predetermined period of time has elapsed, and when it is determined that the predetermined period of time has elapsed, the controller 3 determines that the plasma has ignited on the side of the microwave transmission window 44*a* in the central portion. Thereafter, in step S9, the controller 3 radiates microwaves from the microwave transmission windows 44*b* to 44*g* in the outer peripheral portion. Thus, it is possible to reliably ignite plasma on the side of the microwave transmission windows 44*b* to 44*g* in the outer peripheral portion as well.

Subsequently, in step S11, the controller 3 performs film formation of a silicon-containing film or the like on the wafer W, and terminates the process.

In the present embodiment, in the chamber 1, the shower plate 151 having a ground potential is provided in a high electric field forming region, which is directly below the microwave radiation plate 50, and in which the microwave transmission windows 44 having the microwave radiation surfaces are exposed. As a result, when the microwaves are radiated from the microwave transmission windows 44, the plasma generation space U1 defined by the microwave radiation plate 50 and the shower plate 151 becomes the high electric field region, and plasma of the first gas supplied to the plasma generation space U1 is generated. At this time, the surface waves formed immediately below the microwave radiation surfaces are confined in the plasma generation space U1 which is the high electric field region. Therefore, it is possible to maintain power absorption efficiency of plasma to be high in the plasma generation space U1. In addition, the protrusion 24 is provided in the vicinity of a microwave transmission window 44 and functions as a plasma ignition source. As a result, stable discharge is likely to occur in the plasma generation space U1, and abnormal discharge is less likely to occur. Thus, it is possible to facilitate the plasma ignition and to improve the radical generation efficiency.

The protrusion 24 may be configured to function as an insulating probe to detect a state of plasma. Thus, it is possible to monitor an electron density and electron temperature of the plasma in the chamber 1 and analyze the state of the plasma, by transmitting a signal acquired from the insulating probe to a computer connected to the protrusion 24 and analyzing the signal by the computer.

In this case, a window for measurement may be opened in the chamber 1, and a plasma measurement monitor (an optical emission spectrometer (OES), an insulating probe, or the like) may be installed to detect the state of plasma.

It should be understood that the plasma processing apparatus and the plasma processing method according to the embodiments disclosed herein are exemplary in all aspects and not restrictive. The embodiments may be modified and improved in various forms without departing from the scope and spirit of the appended claims.

According to the present disclosure, it is possible to facilitate plasma ignition and improve radical generation efficiency.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
   a chamber;
   a stage provided in the chamber;
   a microwave transmission window provided on a wall surface of the chamber;
   a microwave supply configured to supply microwaves into the chamber via the microwave transmission window;
   a shower plate configured to partition an interior of the chamber into a plasma generation space, which is a region where the microwave transmission window is disposed, and a processing space, which is a region where the stage is disposed; and
   a protrusion protruding from the shower plate toward the microwave transmission window, disposed in the plasma generation space, and including a conductor in at least a portion of the protrusion,
   wherein the protrusion is configured to function as a plasma ignition source and to generate standing waves between the microwave transmission window and the protrusion.

2. The plasma processing apparatus of claim 1, wherein a portion of the protrusion close to the microwave transmission window is formed of a dielectric material, and wherein the conductor is located close to the microwave transmission window via the dielectric material.

3. The plasma processing apparatus of claim 2, wherein a gas hole that is open toward the microwave transmission window is formed in the protrusion.

4. The plasma processing apparatus of claim 3, wherein an end face of the gas hole is enlarged in diameter.

5. The plasma processing apparatus of claim 4, wherein a shortest distance from the conductor to a surface of the microwave transmission window is 3 mm to 10 mm.

6. The plasma processing apparatus of claim 5, wherein a plurality of through-holes is formed in the shower plate.

7. The plasma processing apparatus of claim 6, wherein the microwave transmission window includes a plurality of microwave transmission windows provided in a central portion of the wall surface of the chamber and an outer peripheral portion surrounding the central portion, respectively, and
   wherein the protrusion includes one or more protrusions facing at least one of the plurality of microwave transmission windows.

8. The plasma processing apparatus of claim 7, wherein the protrusion includes one protrusion facing the microwave transmission window in the central portion.

9. The plasma processing apparatus of claim 7, wherein the protrusion includes a plurality of protrusions facing the microwave transmission window in the central portion and the microwave transmission windows in the outer peripheral portion, respectively.

10. The plasma processing apparatus of claim 1, wherein a gas hole that is open toward the microwave transmission window is formed in the protrusion.

11. The plasma processing apparatus of claim 1, wherein a shortest distance from the conductor to a surface of the microwave transmission window is 3 mm to 10 mm.

12. The plasma processing apparatus of claim 1, wherein a plurality of through-holes is formed in the shower plate.

13. The plasma processing apparatus of claim 1, wherein the microwave transmission window includes a plurality of microwave transmission windows provided in a central portion of the wall surface of the chamber and an outer peripheral portion surrounding the central portion, respectively, and
   wherein the protrusion includes one or more protrusions facing at least one of the plurality of microwave transmission windows.

14. A plasma processing method executed by the plasma processing apparatus of claim 7, the method comprising:
   (a) preparing a substrate;
   (b) supplying a gas into the chamber;
   (c) supplying microwave power to at least one of the plurality of microwave transmission windows to ignite plasma;
   (d) after a predetermined period of time has elapsed from (c), supplying microwave power to remaining ones of the plurality of microwave transmission windows to which the microwave power has not been supplied in (c); and
   (e) executing a predetermined process on the substrate by the plasma.

15. The plasma processing method of claim 14, wherein (c) includes supplying the microwave power to the microwave transmission window in the central portion, and
   wherein (d) includes supplying the microwave power to the microwave transmission windows in the outer peripheral portion.

* * * * *